United States Patent
Sasaki et al.

[19]

[11] Patent Number: 5,887,030
[45] Date of Patent: Mar. 23, 1999

[54] DATA REPRODUCING APPARATUS HAVING EQUALIZATION CHARACTERISTICS WHICH CAN BE CONTROLLED

[75] Inventors: Yoshiyuki Sasaki, deceased, late of Kanagawa-ken; Hana Sasaki, legal representative, Tokyo; Shinichi Yamashita, Kanagawa, all of Japan

[73] Assignee: Canon Kabushiki Kaisha, Tokyo, Japan

[21] Appl. No.: 574,350

[22] Filed: Dec. 18, 1995

[30] Foreign Application Priority Data

Dec. 21, 1994 [JP] Japan .................................. 6-318288
Dec. 21, 1994 [JP] Japan .................................. 6-318289

[51] Int. Cl.$^6$ .............................. H03H 7/30; H03D 3/24
[52] U.S. Cl. ........................... 375/229; 360/65; 375/376; 333/28 R
[58] Field of Search .................................... 375/229, 230, 375/232, 376; 333/18, 28 R; 360/65; 327/553; 386/40, 124

[56] References Cited

U.S. PATENT DOCUMENTS

| | | | |
|---|---|---|---|
| 3,818,359 | 6/1974 | Hekimian | 327/557 |
| 4,361,892 | 11/1982 | Martin | 375/232 |
| 4,413,240 | 11/1983 | Dyke | 333/17.1 |
| 4,737,866 | 4/1988 | Ebata | 360/51 |
| 4,943,789 | 7/1990 | Surie | 333/18 |
| 5,166,955 | 11/1992 | Ohta | 375/229 |
| 5,202,655 | 4/1993 | Hara | 333/215 |
| 5,231,390 | 7/1993 | Mittel | 340/825.44 |
| 5,572,163 | 11/1996 | Kimura et al. | 327/553 |

FOREIGN PATENT DOCUMENTS 60-247862  12/1985  Japan .

*Primary Examiner*—Stephen Chin
*Assistant Examiner*—Betsy L. Deppe
*Attorney, Agent, or Firm*—Robin, Blecker & Daley

[57] ABSTRACT

A reproducing apparatus includes an equalizer for equalizing reproduced data, a clock generating circuit for generating a clock synchronized with the reproduced data, and a phase difference detector for detecting a phase difference between the reproduced data equalized by the equalizer and the clock. The clock generating circuit receives an output from the phase difference detector as a control signal, and generates a clock of frequency according to the output from the phase difference detector. The equalization characteristic of the equalizer is controlled by the control signal of the clock generating circuit. With this arrangement, it is possible to generate a clock which follows a variation in the frequency of the reproduced data, and it is also possible to realize an optimum equalization characteristic according to the variation in the frequency of the reproduced data.

41 Claims, 17 Drawing Sheets

$$f = \frac{1}{2\pi\sqrt{LC}}$$

Ix : REFERENCE CURRENT
1/k : ATTENUATOR

FIG.19

| VARIATION RATIO | EQUIVALENT INDUCTOR | COMBINED RESISTANCE | Q |
|---|---|---|---|
| 0.8 | 1.25L | 1.28Rx | 0.9760Q₀ |
| 0.9 | 1.11L | 1.12Rx | 0.9910Q₀ |
| 1.0 | 1.00L | 1.00Rx | 1.0000Q₀ |
| 1.1 | 0.91L | 0.91Rx | 1.0000Q₀ |
| 1.2 | 0.83L | 0.85Rx | 0.9760Q₀ |

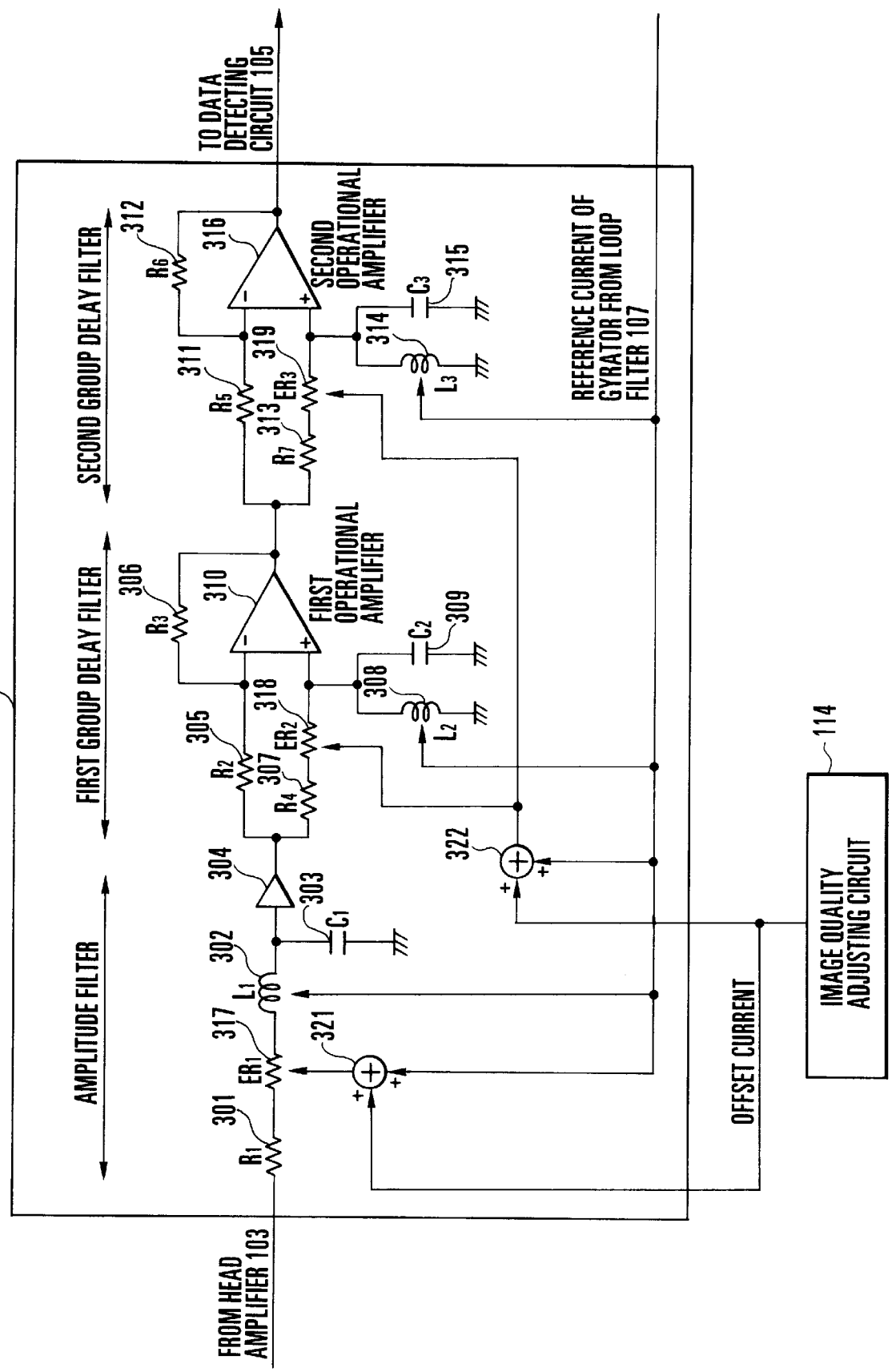

DATA REPRODUCING APPARATUS HAVING EQUALIZATION CHARACTERISTICS WHICH CAN BE CONTROLLED

BACKGROUND OF THE INVENTION

1. Field of the Invention

The present invention relates to a data reproducing apparatus and, more particularly, to an apparatus for reproducing digital data, such as a digital VTR (video tape reproducer).

2. Description of the Related Art

One known example of this kind of apparatus is a digital VTR for recording and reproducing a video signal onto and from a magnetic tape in the form of a digital signal.

Such a digital VTR will be described below.

FIG. 1 is a block diagram of a reproducing system which is provided in the digital VTR.

In FIG. 1, reference numeral 101 denotes a magnetic tape. The reproducing system shown in FIG. 1 includes a recording and reproducing magnetic head 102, a head amplifier 103 for amplifying a reproduced signal supplied from the magnetic head 102, a reproduction equalizer 104 for equalizing the output from the head amplifier 103, the reproduction equalizer 104 including an LC network or the like having predetermined frequency characteristics, a data detecting circuit 105 for again converting the output from the reproduction equalizer 104 into a digital signal, which output is a signal having an amplitude which varies in analog form, a phase detector 106 for detecting a phase difference between the output from the data detecting circuit 105 and the output from an oscillator 108, and a loop filter 107 for filtering a phase error signal outputted from the phase detector 106 and feeding the resultant signal back to the oscillator 108 as negative feedback. The phase detector 106, the loop filter 107 and the oscillator 108 constitute a PLL (phase-locked loop) circuit for generating clock signals for data detection and clock signals for use in individual parts of the apparatus.

The reproducing system shown in FIG. 1 also includes a D flip-flop 110 for latching the output from the data detecting circuit 105 in accordance with a clock pulse which is the output from the oscillator 108, a demodulator 111 for digitally demodulating the data latched by the D flip-flop 110, an error-correcting decoding circuit 112 for detecting an error contained in the demodulated reproduced data and performing error correction on the data, and a reproduced signal processing circuit 113 for performing signal processing substantially opposite to that performed during recording, on the data which has been subjected to the error correction.

The operation of the reproducing system will be described below. The magnetic head 102 provides a small-level reproduced signal by tracing the magnetic tape 101 on which digital data, such as image data, is recorded, and the head amplifier 103 amplifies the small-level reproduced signal by 50–60 dB. The amplitude of the reproduced signal provided by the magnetic head 102 has the frequency characteristic shown in FIG. 2, i.e., a differential characteristic in the range of low frequencies and an attenuated characteristic due to various losses in the range of high frequencies. The reproduction equalizer 104, therefore, corrects the amplitude of the reproduced signal by using the characteristic shown in FIG. 3 which is opposite to that shown in FIG. 2. This equalization method is called integral equalization.

The data detecting circuit 105 converts the output signal from the reproduction equalizer 104 into reproduced digital data on the basis of a threshold level such as that shown in FIG. 4 by using a comparator or the like.

The phase detector 106 generates a phase error signal indicative of the phase difference between the output from the data detecting circuit 105 and the output from the oscillator 108, and the loop filter 107 performs filtering on the phase error signal and feeds back the filtered phase error signal to the control input of the oscillator 108 as negative feedback. Thus, a clock signal synchronized with the reproduced digital data is provided at the output of the oscillator 108.

The D flip-flop 110 latches the output from the data detecting circuit 105 in accordance with the clock signal, and the demodulator 111 applies digital demodulation processing based on inverse interleaved NRZI or other techniques to the digital data outputted from the D flip-flop 110. The error-correcting decoding circuit 112 performs error correction by using error-correcting parity bits added during recording, and the reproduced signal processing circuit 113 performs signal processing opposite to that performed during recording, thereby providing a reproduced video signal.

The reproduction equalizer 104 and the oscillator 108 will be described below in further detail. As shown in FIG. 3, the frequency characteristic of the reproduction equalizer 104 is not a first-order filter characteristic, such as a monotonous increase or a monotonous decrease. For this reason, in a conventional arrangement, second-order filters each consisting of a combination of an inductor L and a capacitor C are connected by buffers, as shown in FIG. 5 by way of example, whereby the characteristics of a plurality of filters each having a different cut-off frequency and a different Q (Quality Factor) are combined to realize the characteristic shown in FIG. 3.

The oscillator 108 employs a circuit construction, such as that shown in FIG. 6 by way of example. A second-order filter (resonant circuit) composed of an inductor L and a capacitor C is driven by a voltage-controlled current source 201, and the oscillator 108 oscillates at the resonant frequency of the second-order filter:

$$f = \frac{1}{2\pi\sqrt{LC}}$$

If a variable capacitance diode is used as the capacitor C, the oscillation frequency of the oscillator 108 can be controlled by varying the capacitance of the variable capacitance diode by using a control voltage.

A method of realizing the reproduction equalizer 104 on an integrated circuit will be described below. FIG. 7 show one example of the circuit called a gyrator that is described in "Y/C one-chip IC for video movie: AN 2400", National Technical Report, Vol. 39, No. 6, December 1993. The relationship between a current $i_1$ which flows from a terminal A to a terminal A' and a voltage $V_1$ across both terminals A and A'0 is expressed by the following equation:

$$V_1 = jwC_0 \cdot R_{01} \cdot R_{02} \cdot \frac{I_3}{I_1} \cdot i_1 \tag{1}$$

where $I_1$ and $I_3$ represent direct currents and $i_1$ represents an alternating current.

Thus, $$L = C_0 \cdot R_{01} \cdot R_{02} \cdot \frac{I_3}{I_1} \tag{2}$$

Therefore, R (resistor) and C (capacitor) can be used to realize the inductor L on an integrated circuit. If $I_3$ is fixed and $I_1$ is made variable, the L value can be varied.

A method of suppressing a variation in a filter characteristic due to variations in an R value and a C value will be described below.

FIG. 8 is a block diagram showing the construction of a circuit for controlling the characteristic of a second-order filter. In the circuit shown in FIG. 8, the target cut-off frequency of the second-order low-pass filter shown by dashed lines is made equal to the oscillation frequency of a quartz-crystal oscillator 202. In this circuit, a feedback loop is formed which is arranged to vary the reference current $I_1$ of FIG. 7 and Equation (2) so that the phase difference between a signal delayed by 90° at the cut-off frequency and the output from the quartz-crystal oscillator 202 is made 90°, thereby adjusting an L value to obtain the target cut-off frequency.

The feature of the integrated circuit is that since the dispersion of the relative values between the individual resistors or the individual capacitors is extremely small and the inductors shown in FIG. 5 are formed by gyrators, the characteristics of the reproduction equalizer can be adjusted to appropriate characteristics by simultaneously controlling the reference currents $I_1$ of all the gyrators.

In such a digital VTR, during a special reproduction mode such as fast forward feed and special reproduction, the speed at which a magnetic head scans magnetic tape (head relative speed) varies, so that the frequency of a reproduced signal varies.

Accordingly, if the characteristics of the reproduction equalizer are fixed, no optimum characteristics can be obtained and more errors are contained in reproduced digital data, so that a visually impaired image, such as an image containing white spots, is reproduced.

For this reason, it is necessary to control the characteristics of the reproduction equalizer and those of the PLL circuit for generating a clock signal, so that there is a need to use not only a phase detector and an oscillator which constitute the clock-generating PLL circuit, but also another group of phase detector and oscillator for adjusting the reproduction equalizer. This leads to the problem that a complicated circuit and a cost increase are needed.

SUMMARY OF THE INVENTION

It is, therefore, an object of the present invention to solve the above-described problems.

Another object of the present invention is to provide an apparatus capable of optimally controlling through a simple construction a reproduction equalizer and a clock generating operation even if the speed of reproduction of data varies.

To achieve the above objects, according to one aspect of the present invention, a reproducing apparatus comprises reproducing means for reproducing data, equalizing means for equalizing the reproduced data, generating means for generating a clock synchronized with the reproduced data, and phase difference detecting means for detecting a phase difference between the reproduced data equalized by the equalizing means and the clock, a generating operation of the generating means and an equalization characteristic of the equalizing means being controlled on the basis of an output from the phase difference detecting means.

Another object of the present invention is to absorb the influence of the dispersion of the absolute values of circuit elements such as resistors and capacitors and perform equalizing processing for a good amplitude characteristic and group delay characteristic.

Yet another object of the present invention, a reproducing apparatus comprises reproducing means for reproducing data, equalizing means for equalizing the reproduced data, the equalizing means including a plurality of filter circuits having equivalent inductors and equivalent resistors, the equivalent inductors and the equivalent resistors being respectively formed by gyrators each of which can be controlled by a reference current, and control means for supplying the reference current to all the gyrators of the equalizing means.

The above and other objects, features and advantages of the present invention will become apparent from the following detailed description of preferred embodiments of the present invention, taken in conjunction with the accompanying drawings.

BRIEF DESCRIPTION OF THE DRAWINGS

FIG. 19 is a table showing the relationship between the variation ratio of C and Q of the circuit shown in FIG. 9;

FIG. 22 is a circuit diagram showing another example of the reproduction equalizer shown in FIG. 9.

DETAILED DESCRIPTION OF THE PREFERRED EMBODIMENTS

Figure 1:
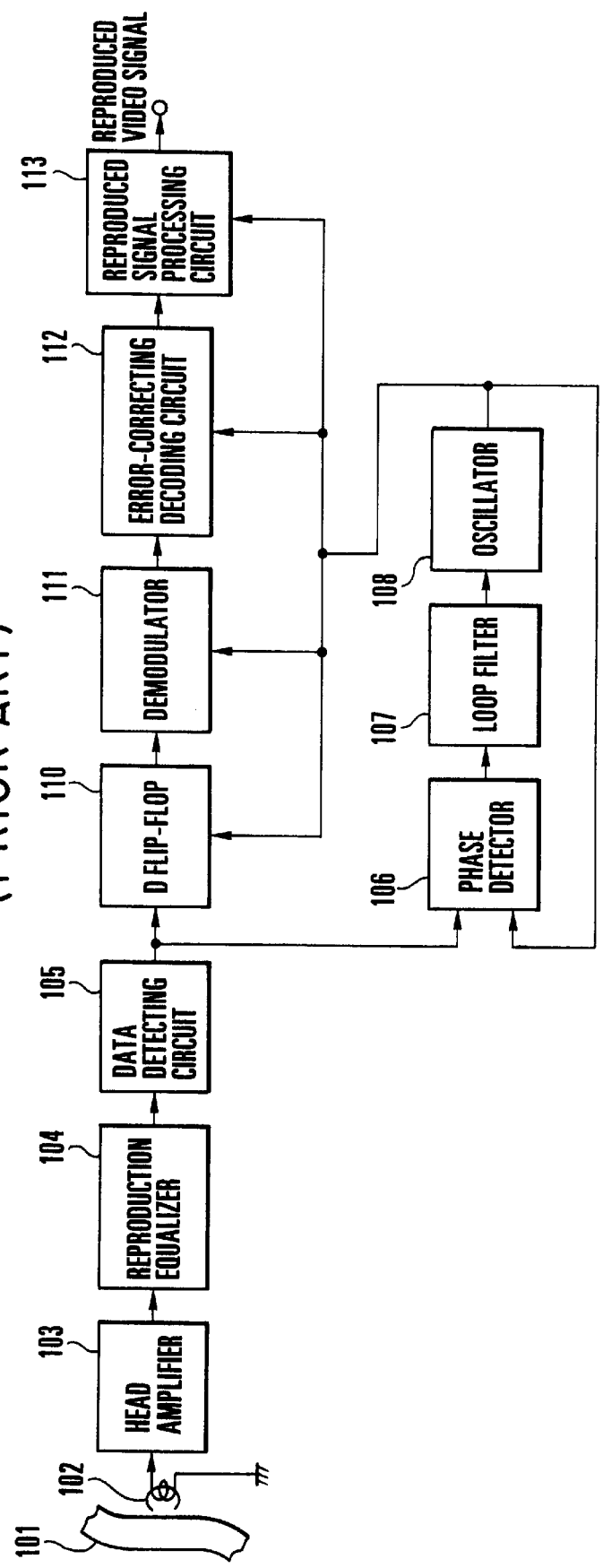
FIG. 1 is a block diagram of the construction of a reproducing system of a conventional digital VTR.
Figure 2:
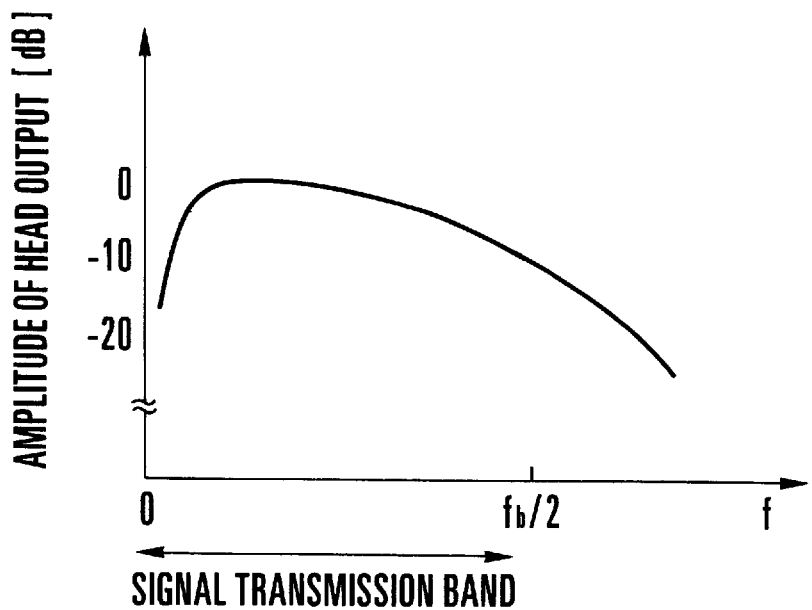
FIG. 2 is a graph showing the frequency characteristic of reproduced data obtained in the apparatus shown in FIG. 1.
Figure 3:
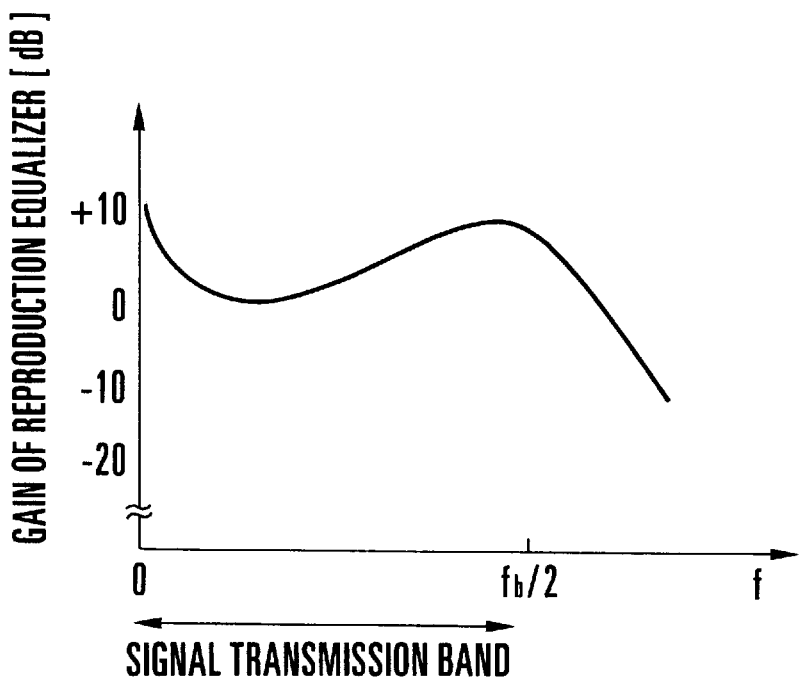
FIG. 3 is a graph showing the equalization characteristic of the reproduction equalizer shown in FIG. 1.
Figure 4:
FIG. 4 is a view aiding in describing the operation of the data detecting circuit provided in the apparatus shown in FIG. 1.
Figure 5:
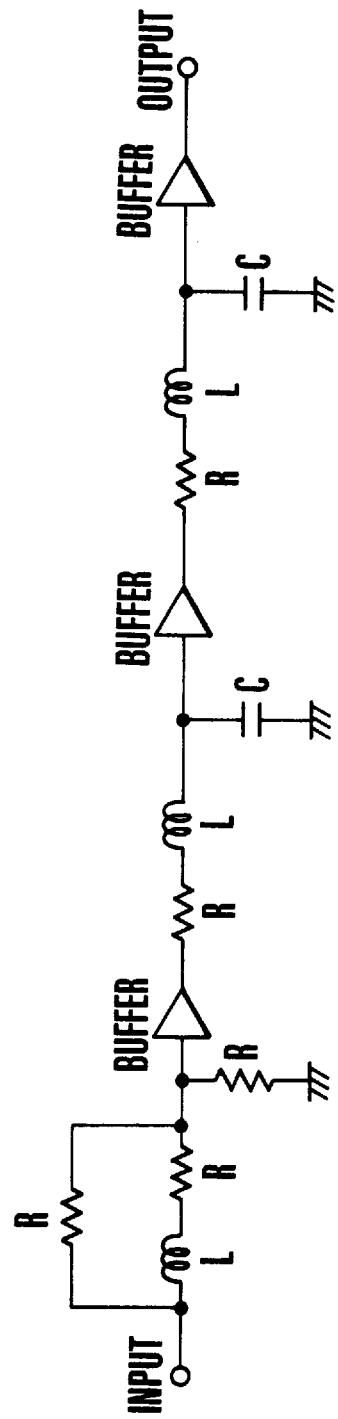
FIG. 5 is a view showing a construction example of the reproduction equalizer provided in the apparatus shown in FIG. 1.
Figure 6:
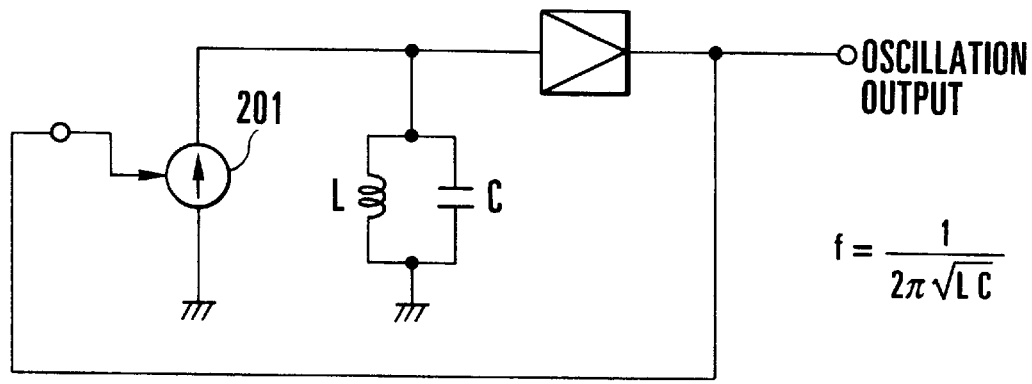
FIG. 6 is a circuit diagram showing the construction of the oscillator provided in the apparatus shown in FIG. 1.
Figure 9:
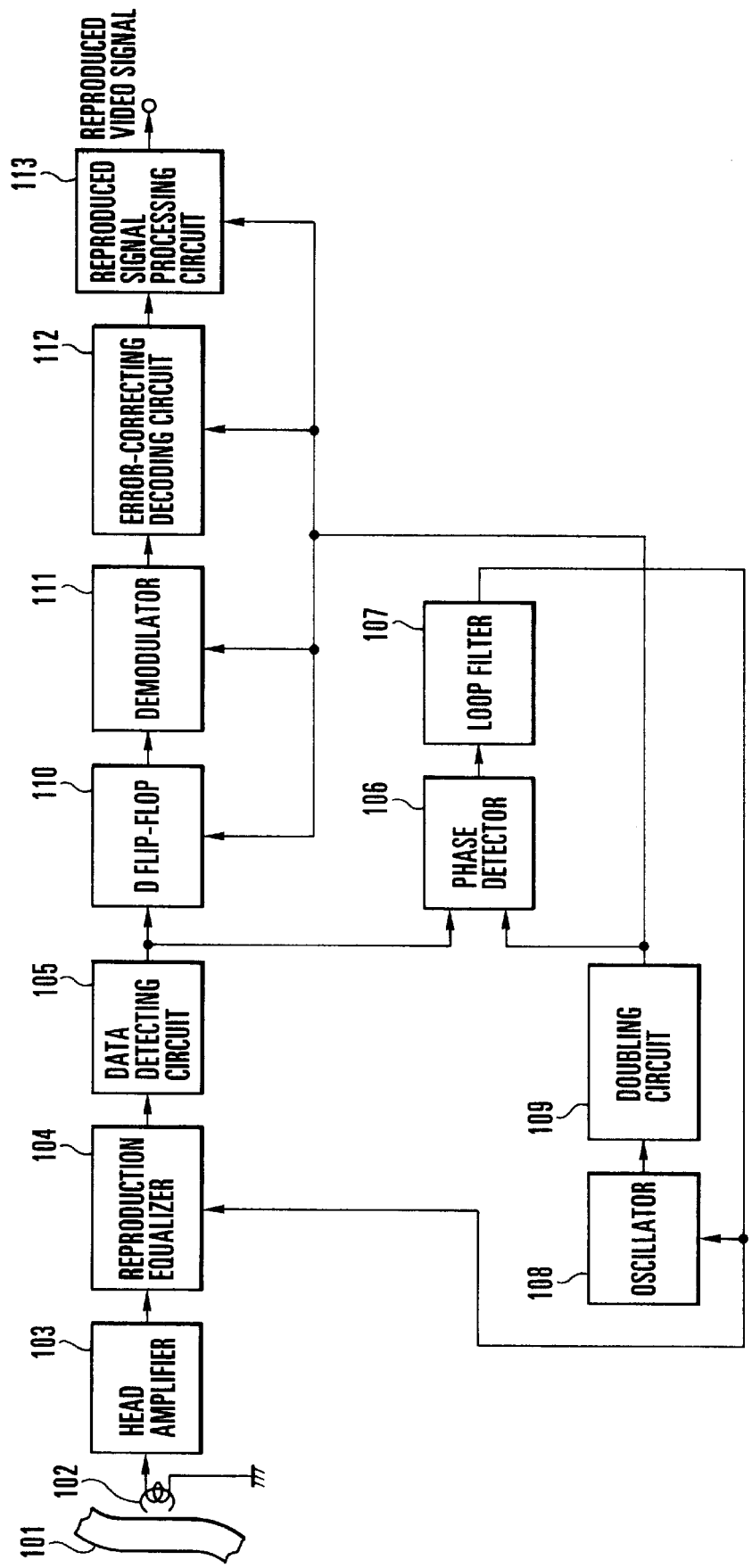
FIG. 9 is a block diagram showing the construction of a digital VTR to which the present invention is applied.

Embodiments of the present invention will be described below in detail with reference to the accompanying drawings. FIG. 9 is a block diagram showing the construction of a reproducing system which is provided in a digital VTR according to an embodiment of the present invention. In FIG. 9, identical reference numerals are used to denote constituent elements identical to those shown in FIG. 1. In the reproducing system shown in FIG. 9, an oscillator 108 and a reproduction equalizer 104 are controlled by the output from a loop filter 107. The control of the reproduction equalizer 104 and the oscillator 108 will be described below in detail.

Figure 10:
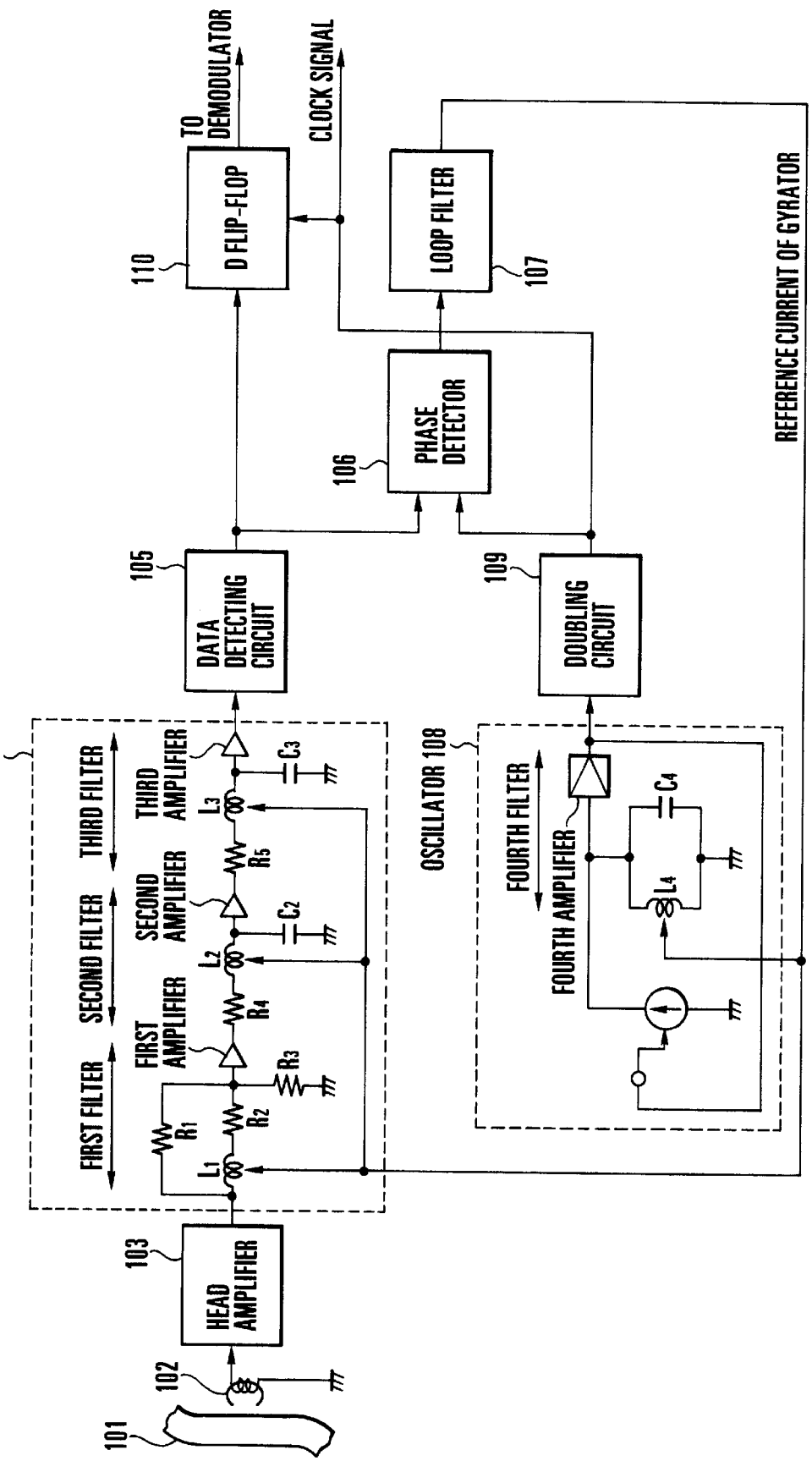
FIG. 10 is a block diagram showing the construction of the essential portion of the digital VTR shown in FIG. 9.

FIG. 10 is a block diagram of the digital VTR according to the embodiment of the present invention, and specifically shows a reproduction equalizer and an oscillator as well as other associated constituent elements.

In the arrangement shown in FIG. 10, resistors $R_1$, $R_2$ and $R_3$, an inductor $L_1$ and a first amplifier constitute a first filter of the first order; a resistor $R_4$, an inductor $L_2$, a capacitor $C_2$ and a second amplifier constitute a second filter of the second order; and a resistor $R_5$, an inductor $L_3$, a capacitor $C_3$ and a third amplifier constitute a third filter of the second order. These three filters constitute the reproduction equalizer 104.

An inductor $L_4$, a capacitor $C_4$ and a fourth amplifier constitute a fourth filter of the second order for determining the oscillation frequency of the oscillator 108. The output from the oscillator 108 is doubled in frequency by a doubling circuit 109, and the output from the doubling circuit 109 is supplied as a clock signal to each digital circuit of the reproducing system, such as a phase detector 106 and a D flip-flop 110.

The operation of this embodiment will be described below. This embodiment employs an integrated circuit on which gyrators each having a similar circuit form and mask construction are formed, and each of the gyrators has a capacitor $C_0$ which serves as a gyrator load (refer to FIG. 7). The capacitance values of the capacitors $C_0$ are selected to be equal to each other so that the inductors $L_1$, $L_2$, $L_3$ and $L_4$ which are formed as equivalent inductors are given an approximately equal inductance.

Figure 11A:
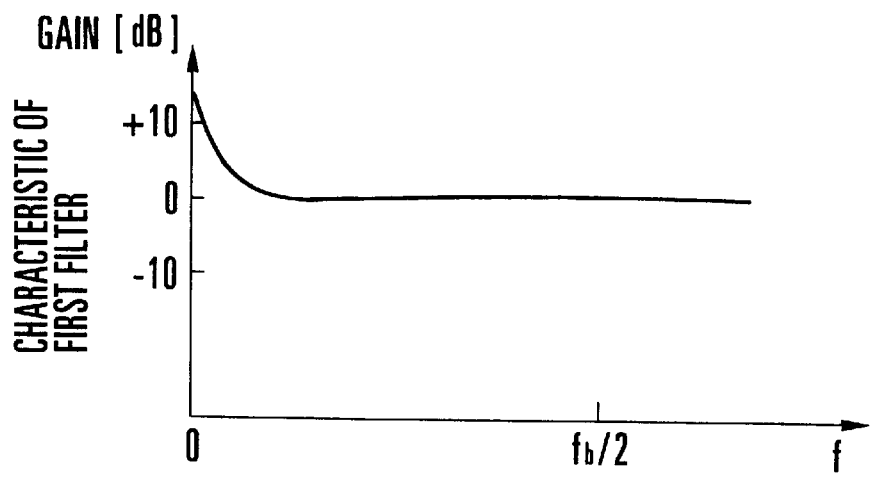
FIGS. 11(a), 11(b) and 11(c) are graphs showing the characteristics of the respective filters provided in the reproduction equalizer shown in FIG. 9.
Figure 11B:
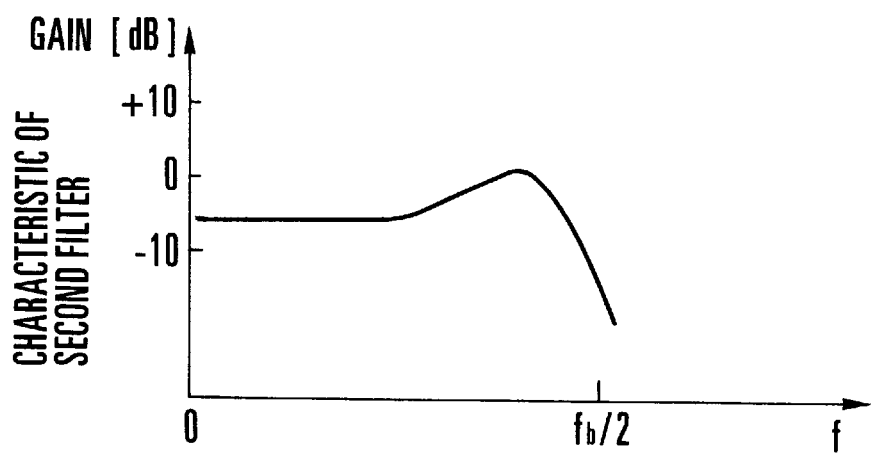
Figure 11C:
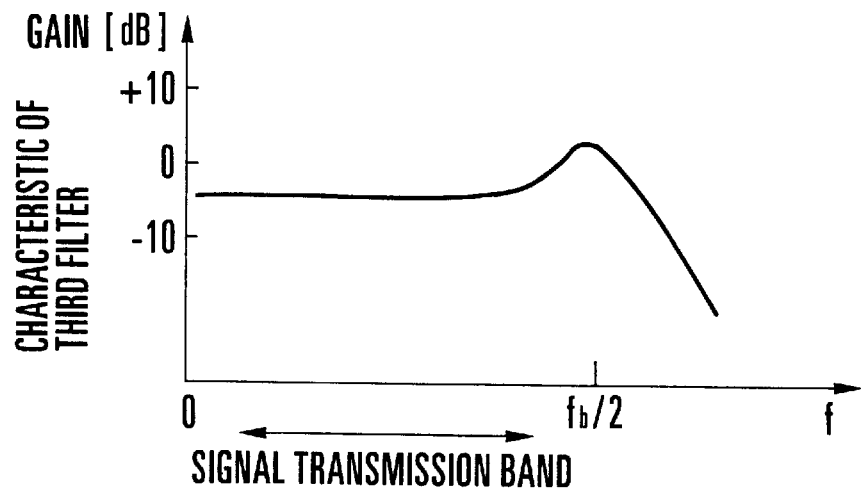

The frequency characteristics of the respective first, second and third filters are determined by selecting the values of the aforesaid resistors and capacitors so that when the reference currents of the respective gyrators are at their central values, the first, second and third filters respectively show the cut-off frequencies and the Qs shown in FIGS. 11(a), 11(b) and 11(c).

The transmission band of the reproduction equalizer 104 is selected to be equivalent to approximately ½ of a signal transmission speed (reproduction clock frequency) fb which satisfies the Nyquist criterion which is known as a signal transmission theory.

Figure 12:
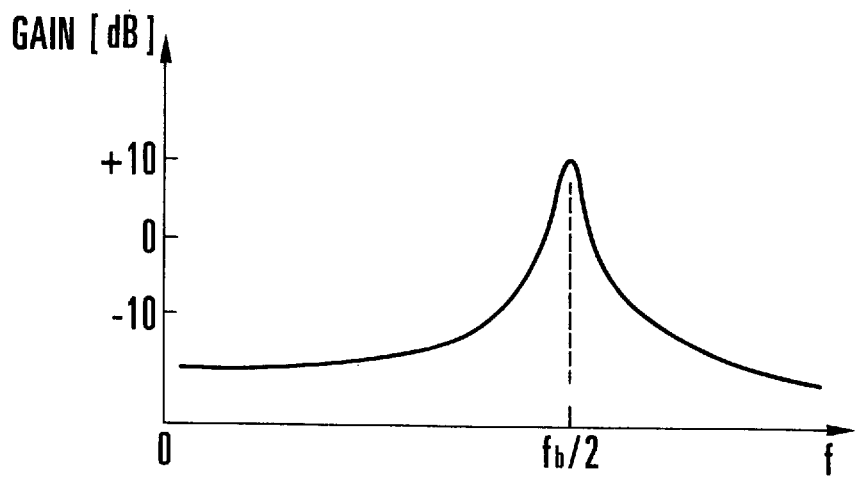
FIG. 12 is a graph showing the frequency characteristic of the filter provided in the oscillator shown in FIG. 9.

The frequency characteristic of the fourth filter which determines the oscillation frequency of the oscillator 108 is a characteristic which shows a sharp peak at fb/2 as shown in FIG. 12 when the reference current of the corresponding gyrator is at its central value. The oscillator 108, therefore, oscillates at a center frequency of fb/2. The output from the oscillator 108 is doubled in frequency by the doubling circuit 109 and the obtained clock signal of frequency fb is supplied to each digital circuit of the reproducing system.

The operation of this embodiment during the normal reproduction of the digital VTR will be described below. A reproduced signal supplied from the head amplifier 103 is initially equalized to such an extent that a phase-locked loop (PLL) can operate, by the reproduction equalizer 104 having no optimum characteristics. The output signal of the reproduction equalizer 104 is converted into a digital signal by a data detecting circuit 105, and the data detecting circuit 105 supplies the digital signal to the phase detector 106. The phase detector 106 detects the phase difference between the reproduced digital data outputted from the data detecting circuit 105 and the clock signal outputted from the doubling circuit 109, and a signal indicative of the phase difference is fed back to the gyrator of each of the first to fourth filters through the loop filter 107 in the form of a reference current as negative feedback. Accordingly, the oscillation frequency of the oscillator 108 which is determined by the cut-off frequency of the fourth filter is automatically adjusted to fb/2.

If the values of the capacitors $C_3$ and $C_4$ used in the respective third and fourth filters are made the same, the cut-off frequency of the third filter can also be constantly kept at fb/2, inclusive of the stray capacity of the corresponding gyrator. The value of the capacitor $C_2$ for use in the second filter can be readily found on the basis of the third filter.

In this embodiment, in the above-described manner, the amount of variation in the absolute value of each R and C value of the integrated circuit is detected on the basis of the reference current of each of the gyrators which is obtained from the PLL circuit for data detection and is used as a control signal for the oscillator, and each of the gyrators of the reproduction equalizer is controlled by the same reference current, whereby the respective cut-off frequencies are adjusted to appropriate frequencies, thereby optimally adjusting the characteristics of the reproduction equalizer.

Figure 13:
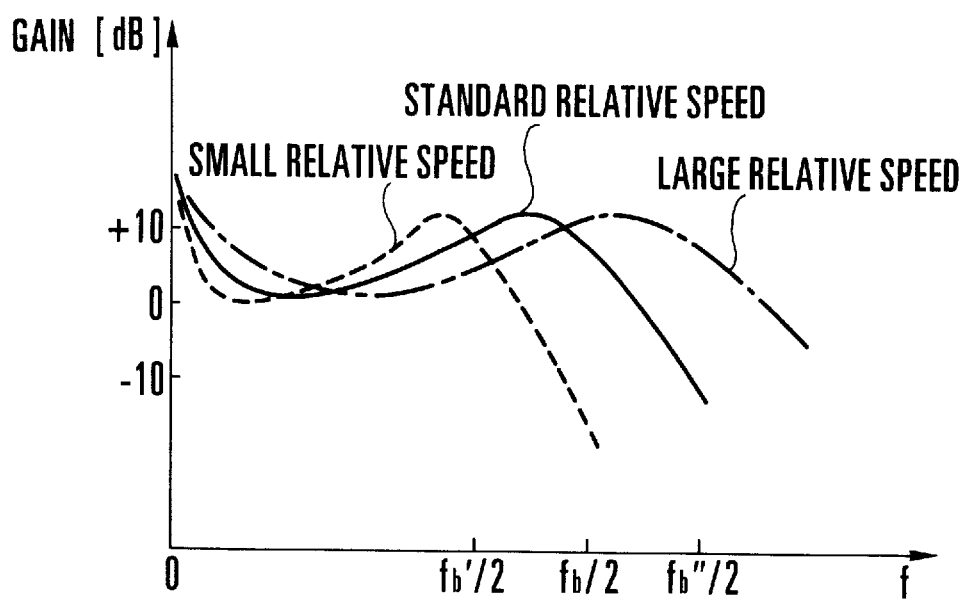
FIG. 13 is a graph showing the equalization characteristic of the reproduction equalizer shown in FIG. 9.

Specifically, during a special reproduction mode, the signal transmission speed fb varies with a variation in the relative speed of a head as described above, but in this embodiment the PLL circuit for data detection follows the variation in the signal transmission speed fb. Accordingly, the transmission band of the reproduction equalizer 104 which is controlled by the control signal for the oscillator 108 as described above is also controlled according to the variation in the signal transmission speed fb, whereby the transmission band can be optimized as shown in FIG. 13.

Figure 14:
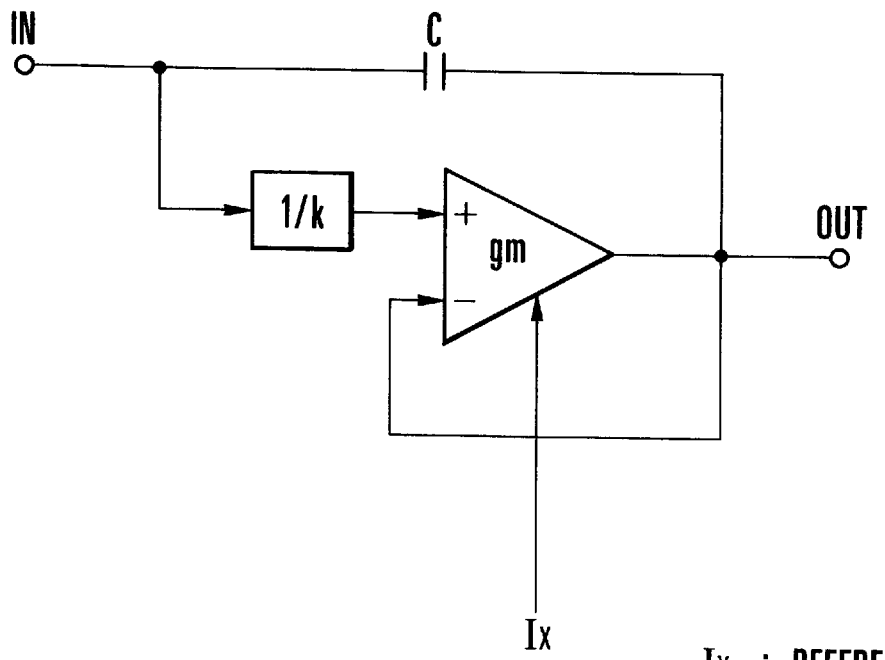
FIG. 14 is a circuit diagram showing the construction of a transconductance circuit for use in the embodiments of the present invention.

The above-described embodiment employs a gyrator as each filter circuit the cut-off frequency of which can be controlled. However, an operation similar to that of the above-described embodiment can be achieved by using another type of filter which can be realized on an integrated circuit and the cut-off frequency of which can be controlled, such as an active filter using a device called a transconductance circuit of the type shown in FIG. 14 which has a voltage-current conversion characteristic (gm) which can be controlled.

In the above description of the aforesaid embodiment, reference has been made to the arrangement in which the reference current of the gyrator of the oscillator is supplied directly to each of the gyrators of the reproduction equalizer. However, since the range of variations in the time base of reproduced digital data in the digital VTR is several kilohertz, the reference current of the gyrator of the oscillator may be smoothened and its low-frequency component may be used as the reference current of each of the gyrators of the reproduction equalizer. With this arrangement, it is possible to realize a far more stable operation.

As is apparent from the above description, by controlling oscillating means and equalizing means on the basis of a signal indicative of the detected phase of input data, it is possible to perform optimum equalization according to a frequency variation in reproduced data without the need to increase the entire circuit scale, and it is also possible to obtain a clock signal synchronized with the reproduced data.

Although in the above-described embodiment the reproduction equalizer 104 is made up of the filters shown in FIG. 10, the reproduction equalizer 104 needs to have as flat group delay characteristics as possible within the required passband, to transmit a pulse waveform of wide frequency band.

If the group delay characteristics are not flat, pulse waveform distortions, such as ringing and smear, will become noticeable, so that no good filter circuit can be obtained.

Figure 15:
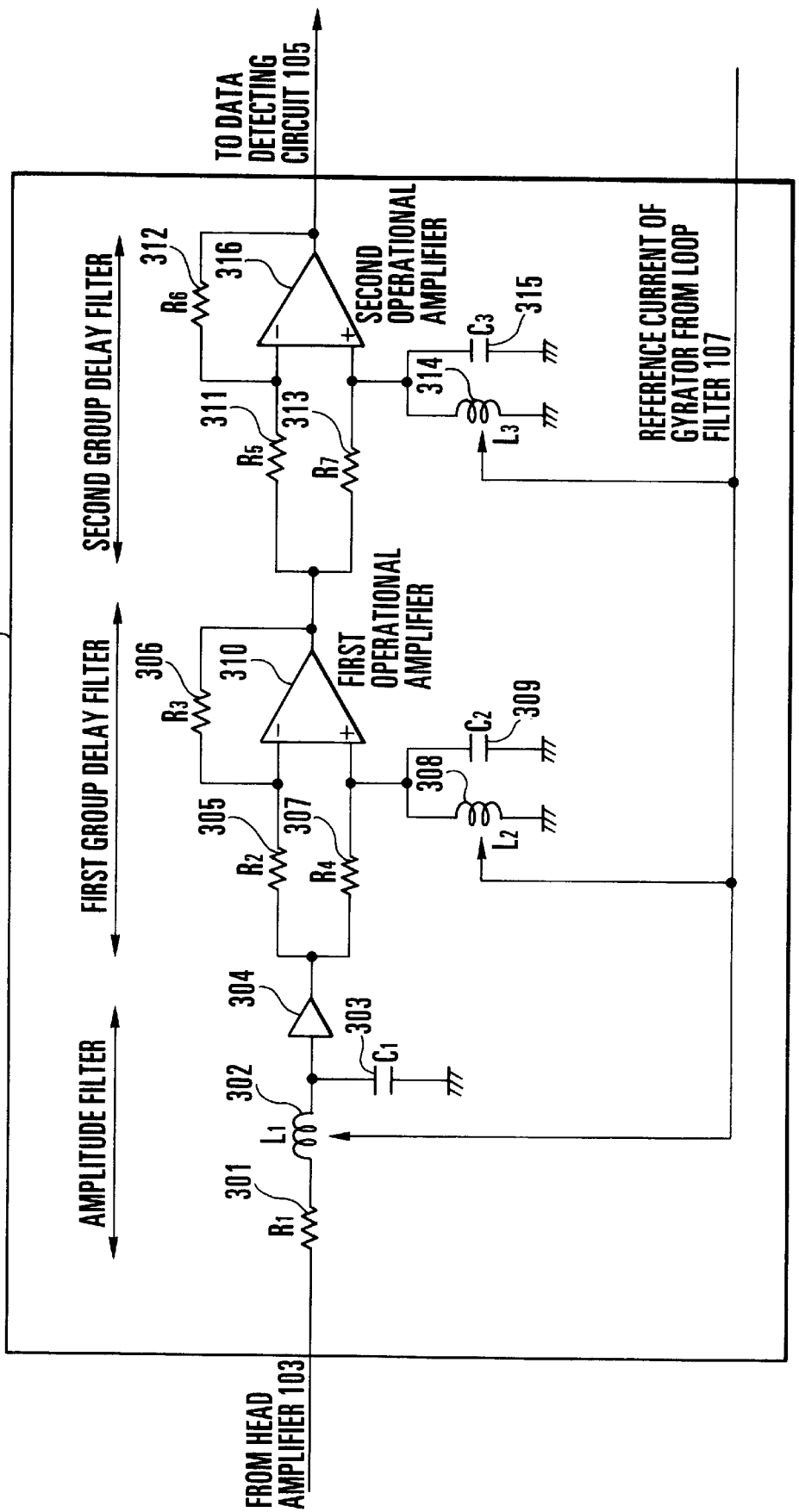
FIG. 15 is a circuit diagram showing another construction of the reproduction equalizer shown in FIG. 9.
Figure 16A:
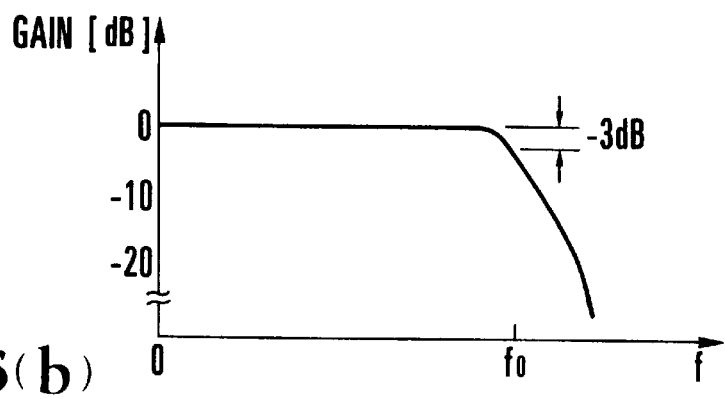
FIGS. 16(a) to 16(d) are graphs showing the characteristics of the circuit shown in FIG. 15.
Figure 16B:
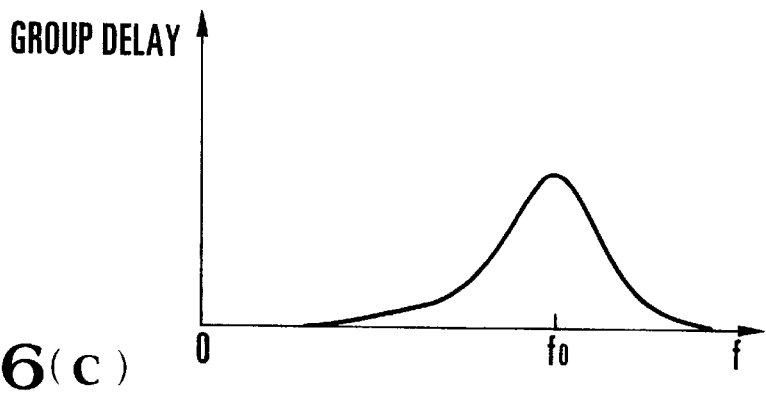
Figure 16C:
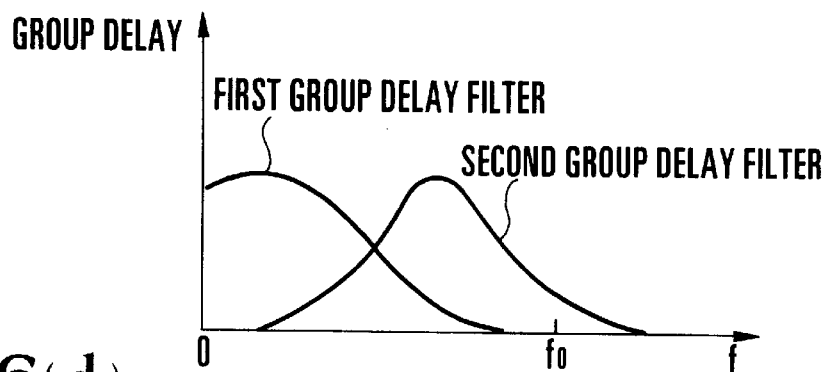
Figure 16D:
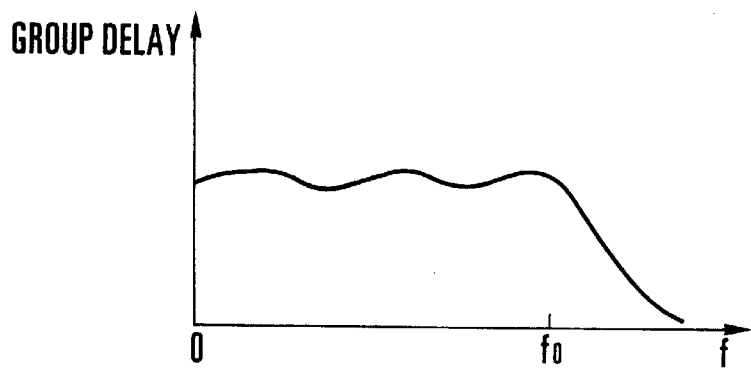
Figure 17A:
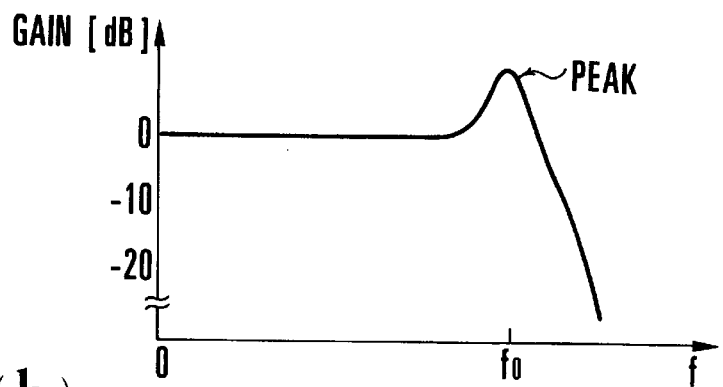
FIGS. 17(a) to 17(d) are graphs showing the characteristics of the circuit shown in FIG. 15.
Figure 17B:
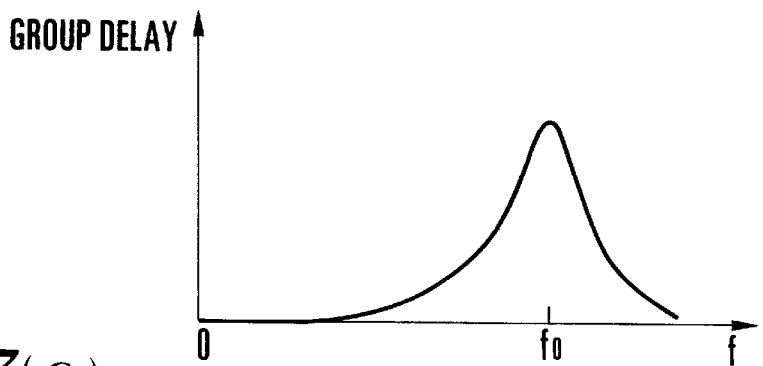
Figure 17C:
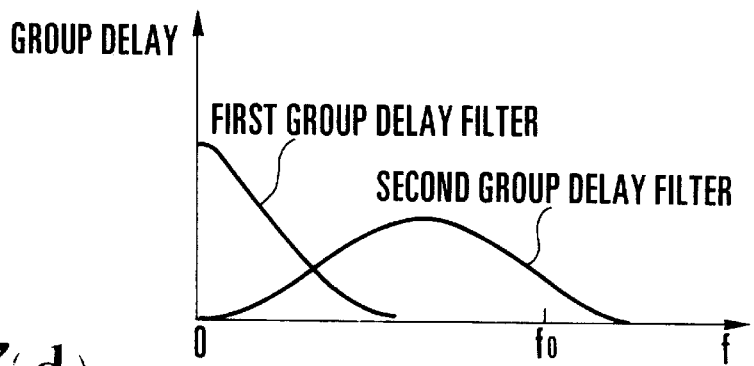
Figure 17D:
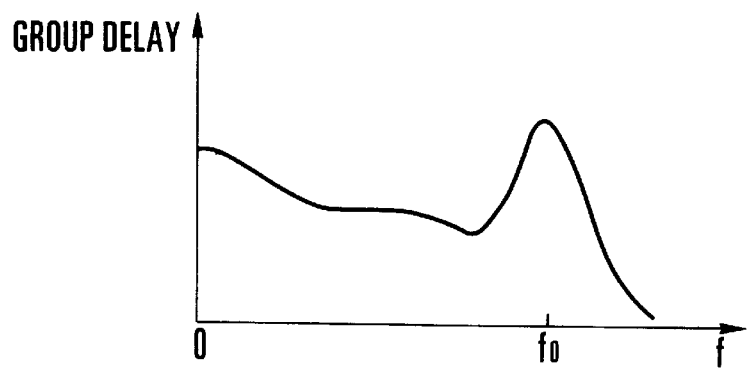

For this reason, the reproduction equalizer 104 may also be constructed in such a manner that an amplitude filter formed by at least one LC network is followed by two or three group delay filters, as shown in FIG. 15. The amplitude and the group delay characteristic of the amplitude filter are assumed to be as shown in FIGS. 16(*a*) and 16(*b*), respectively. To correct the group delay characteristic of the amplitude filter, two group delay filters each including an operational amplifier and a parallel LC network may be used. The respective group delay filters are given the different low-frequency group delay characteristics shown in FIG. 16(*c*) so that an approximately flat group delay characteristic can be obtained as the total characteristic, although some ripples remain within the frequency band of the group delay filters as shown in FIG. 16(*d*).

The inductance of each of the filters shown in FIG. 15 is formed by a gyrator similar to the above-described one, and each gyrator is controlled by the output from the loop filter 107, whereby the cut-off frequency of the reproduction equalizer 104 is controlled according to a variation in the frequency of reproduced data so that the equalization characteristic of the reproduction equalizer 104 can be optimally controlled similarly to the above-described embodiment.

Although the cut-off frequency of the filter circuit used in each of the reproduction equalizers 104 shown in FIGS. 10 and 15 can be adjusted in the above-described manner, the above-described circuit gives no consideration to Q which is an important factor of the filter.

Specifically, the transfer function of a second-order low-pass filter which constitutes the amplitude filter shown in FIG. 15 is expressed by the following equation:

$$H(S) = \frac{\frac{1}{L_1 C_1}}{S^2 + \frac{R_1}{L_1} \cdot S + \frac{1}{L_1 C_1}} \quad (3)$$

$$\text{cut-off frequency } f_0 = \frac{1}{2\pi \sqrt{L_1 C_1}}, Q = \frac{1}{R_1} \cdot \sqrt{\frac{L_1}{C_1}}$$

As is apparent from this equation, even if the cut-off frequency is adjusted to a target frequency by the feedback loop shown in FIG. 15, Q will vary to a great extent. For example, if the value of the capacitor of the amplitude filter becomes 0.8 times as great, $I_1$ in the aforesaid Equation (2) becomes $(0.8)^2$ times as great and L becomes 1.25 times as great. Therefore, although the cut-off frequency is retained, Q becomes 1.25 times as great, so that a peak will occur at the cut-off frequency as shown in FIG. 17(*a*).

The transfer function of the first group delay filter shown in FIG. 15 by way of example is expressed by the following equation if $R_2$ and $R_3$ are equal:

$$H(S) = \frac{-\left(S^2 - \frac{1}{C_2 R_4} \cdot S + \frac{1}{L_2 C_2}\right)}{S^2 + \frac{1}{C_2 R_4} \cdot S + \frac{1}{L_2 C_2}} \quad (4)$$

$$\text{cut-off frequency } f_0 = \frac{1}{2\pi \sqrt{L_2 C_2}}, Q = \frac{1}{R_4} \cdot \sqrt{\frac{L_2}{C_2}}$$

The amplitude characteristic of this group delay filter is flat, and its group delay characteristic has a peak corresponding to Q in the neighborhood of f0. If the value of the capacitor of the group delay filter becomes 0.8 times as great similarly to the case of the aforesaid amplitude filter, Q becomes 0.8 times as great and the peaks of the respective group delay characteristics of the first and second group delay filters shown in FIG. 15 become lower as shown in FIG. 17(*c*).

It is considered, therefore, that even if the cut-off frequency can be retained by the feedback loop, the amplitude characteristic has a peak so that ringing is caused, and the group delay characteristic lowers to a greater extent over its middle and low frequency ranges so that an equalized signal is greatly distorted to produce a visually extremely impaired image.

An embodiment which will be described below relates to an equalizer which is capable of eliminating a variation in Q due to the control of a cut-off frequency and realizing a far better amplitude characteristic and group delay characteristic.

A digital VTR according to this embodiment has a construction similar to that shown in FIG. 9.

The construction and the control of the reproduction equalizer 104 used in this embodiment will be described below.

Figure 18:
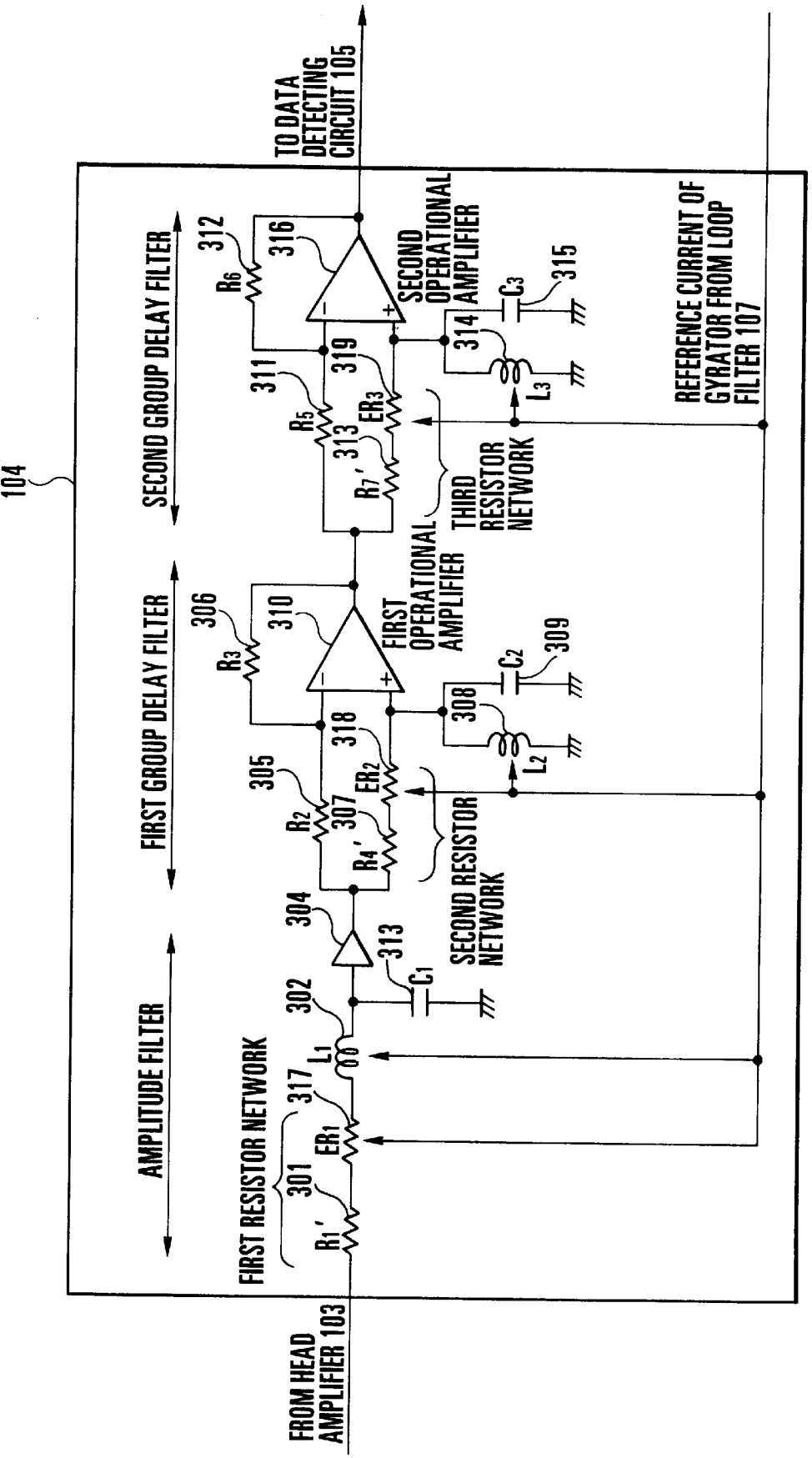
FIG. 18 is a circuit diagram showing yet another construction of the reproduction equalizer shown in FIG. 9.

FIG. 18 is a view showing another construction of the reproduction equalizer 104 shown in FIG. 9, and the reproduction equalizer 104 of FIG. 18 is made up of an amplitude filter and first and second group delay filters similarly to that shown in FIG. 9.

Referring to FIG. 18, the amplitude filter has a first resistor network in which a resistor R' (301) and an equivalent resistor $ER_1$ (317) are connected in series, the first group delay filter has a second resistor network in which a resistor $R_4'$ (307) and an equivalent resistor $E_7'$ (318) are connected in series, and the second group delay filter has a third resistor network in which a resistor $R_7'$ (313) and an equivalent resistor $ER_3$ (319) are connected in series.

The operation of the reproduction equalizer 104 shown in FIG. 18 will be described below. If a resistor $R_{00}$ is substituted for the capacitor $C_0$ in the circuit shown in FIG. 7, the relationship between a current $i_1$ which flows from a terminal A to a terminal A' and a voltage $V_1$ across both terminals A and A' is expressed by the following equation:

$$V_1 = \frac{1}{R_{00}} \cdot R_{01} \cdot R_{02} \cdot \frac{I_3}{I_1} \cdot i_1 \quad (5)$$

Thus, $$R = \frac{1}{R_{00}} \cdot R_{01} \cdot R_{02} \cdot \frac{I_3}{I_1} \quad (6)$$

Therefore, if the reference current $I_1$ of the gyrator is varied similarly to the case of the equivalent inductor, the equivalent resistance value can be varied.

Incidentally, in this embodiment, each gyrator is formed on an integrated circuit in a similar circuit form and with a similar mask construction.

In this embodiment, the resistance value of each of the equivalent resistors is controlled by the reference current $I_1$ of the gyrator obtained when the value of each resistor and capacitor is a central value (design value), so that the resistance value of each of the equivalent resistors becomes approximately equal to that of the corresponding one of the resistors to which the respective equivalent resistors are connected. Thus, in the first resistor network, for example, the resistance value of equivalent resistor $ER_1$ is set as $R_1 \approx ER_1$. Further, the combined resistance value ($R_{NET}$) of each resistor network is selected to be equal to the resistance value of each of the resistors R1, R4 and R7 shown in FIG. 15. Thus, in the first resistor network, $R_1 \approx R_1' + ER_1$.

To give an example, letting $R_x$ be the value of each of the above resistors and X be the variation ratio of each capacitor, the combined resistance value of each of the resistor networks is expressed by the following equation:

$$R_{NET} = \frac{R_X}{2} + \frac{R_X}{2} \cdot \left(\frac{1}{X}\right)^2 \quad (7)$$

$\frac{R_X}{2}$ : series resistance $\frac{R_X}{2} \cdot \left(\frac{1}{X}\right)^2$ : equivalent resistance FIG. 19 shows the variation ratio X of the capacitor obtained from Equation (6), the equivalent inductor, the combined resistance value of the resistor network and the approximate value of Q.

As is apparent from FIG. 19, even if the capacitor varies by ±20%, the variation of Q can be suppressed to:
+0
−2.4 (%)

Accordingly, the feedback loop can be used to adjust the cut-off frequency to a target frequency and to reduce the amount of variation of Q, whereby a filter circuit which is good in amplitude characteristic and group delay characteristic can be realized on an integrated circuit.

Specifically, it is possible to provide an equalization circuit having optimum equalization characteristics.

Figure 7:
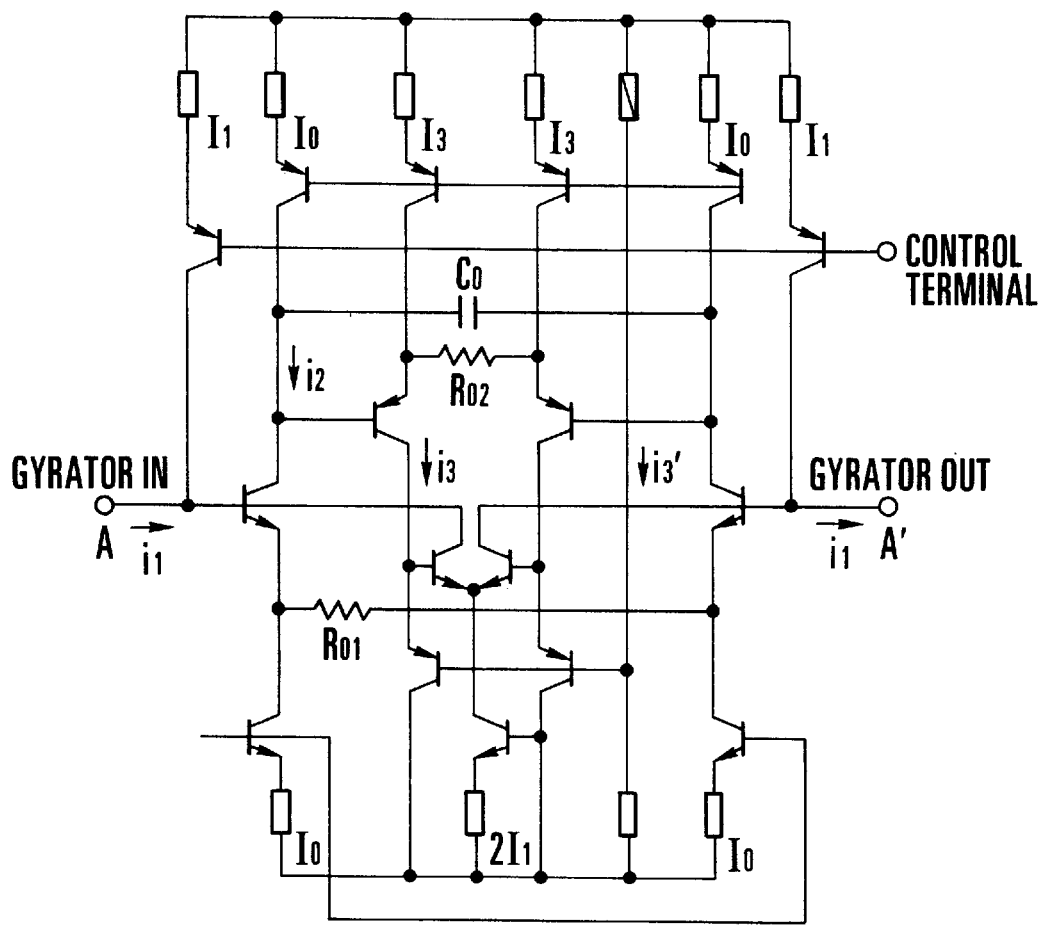
FIG. 7 is a circuit diagram showing the construction of a gyrator for use in each embodiment of the present invention.
Figure 8:
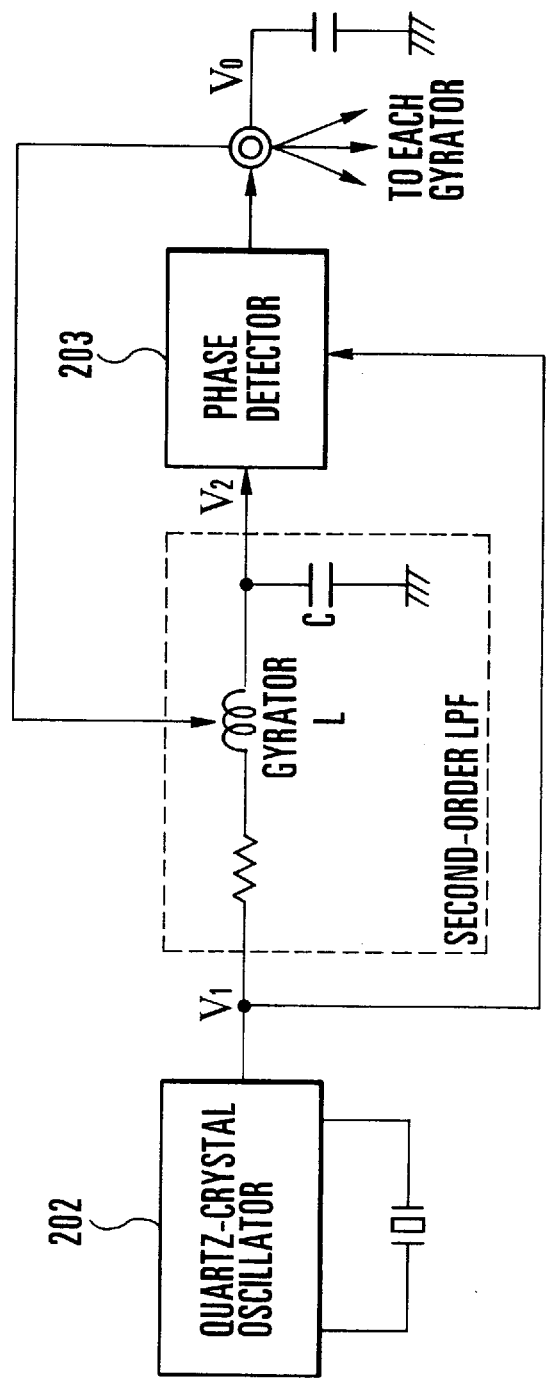
FIG. 8 is a circuit diagram showing a control circuit for controlling the frequency characteristic of a conventional filter.

In this embodiment as well, the inductor L of the oscillator 108 is formed by the gyrator shown in FIG. 7, as described previously, and the reference current of each of the gyrators is controlled by the output from the loop filter 107, whereby the oscillation frequency of the oscillator 108 is controlled to provide a clock signal synchronized with reproduced data.

If the values of the capacitors $C_3$ and $C_4$ used in the second group delay filter and the fourth filter are made the same, the cut-off frequency of the second group delay filter can also be constantly kept fb/2, inclusive of the stray capacity of the corresponding gyrator. The value of the capacitor $C_2$ for use in the first group delay filter can be readily found on the basis of the second group delay filter.

In the above-described manner, the amount of variation in the absolute value of each of the R and C values of the respective filters is detected on the basis of the reference current of each of the gyrators which is obtained from the PLL circuit for data detection and is used as a control signal for the oscillator 108, and the equivalent inductors formed by the respective gyrators of the reproduction equalizer are controlled by the same reference current, whereby the respective cut-off frequencies are adjusted to appropriate frequencies, thereby optimally adjusting the characteristics of the reproduction equalizer. In addition, since the equivalent resistors formed by similar gyrators are controlled by the same control current for controlling the equivalent inductors, the variation of Q can also be suppressed.

Figure 20:
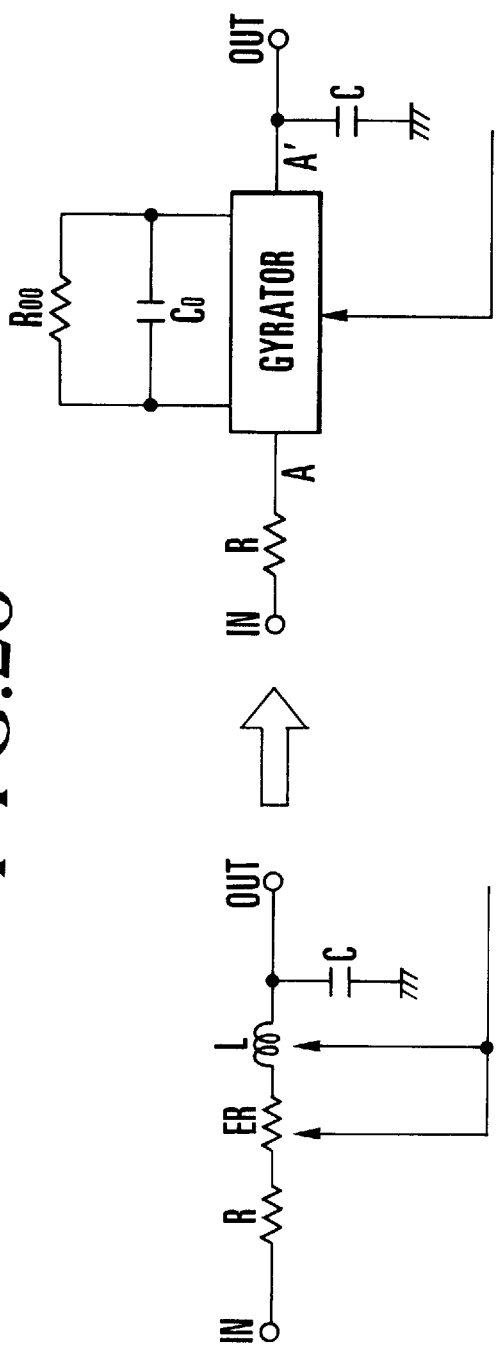
FIG. 20 is a circuit diagram showing another example of the filter shown in FIG. 18.
Figure 21:
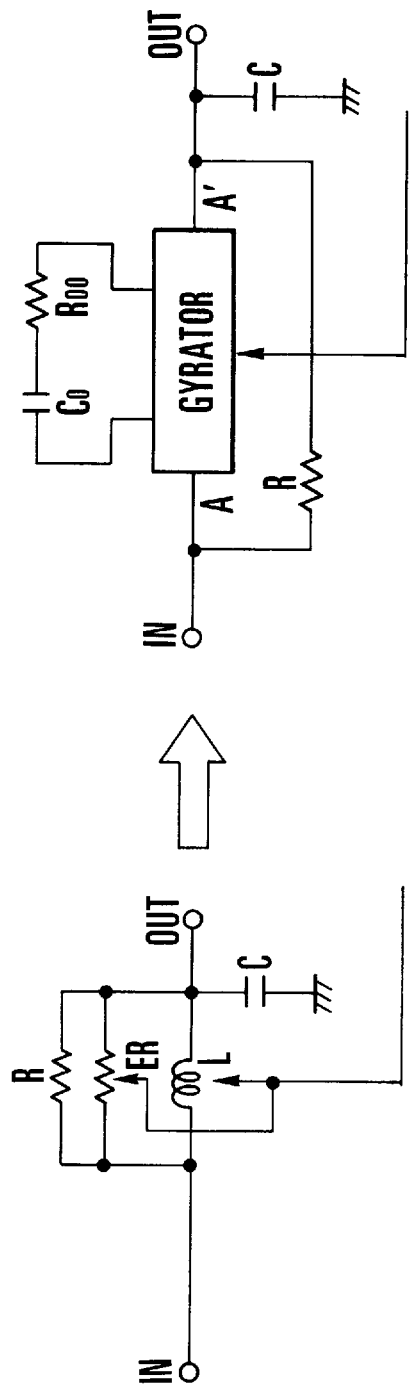
FIG. 21 is a circuit diagram showing yet another example of the filter shown in FIG. 18.

Although in the above-described embodiment a gyrator is newly added to form each of the equivalent resistors and the resistor networks, the second-order low-pass filter shown in FIG. 20 can also be used to realize such an equivalent resistor by adding the resistor $R_{00}$ in parallel with the capacitor $C_0$ of a gyrator which constitutes an equivalent inductor. In addition, the second-order low-pass filter shown in FIG. 21 can also be used to realize a resistor network which is connected in parallel to a gyrator which constitutes an equivalent inductor, by adding the resistor $R_{00}$ in series with the capacitor $C_0$ of the gyrator. Accordingly, an operation similar to that of the above-described embodiment can be achieved by employing various combinations which utilize an arrangement including a resistor network having an equivalent resistor for absorbing a variation in Q.

Although the operation of the aforesaid embodiment has been described with reference to the example in which the absolute value of the capacitor varies, a similar operation can be achieved not only in a case where the absolute value of the resistor varies, but also in a case where the absolute values of both the resistor and the capacitor vary.

In addition, although the aforesaid embodiment has been described with reference to the example in which the characteristics of the amplitude filter are fixed, for example, an image quality adjusting circuit for finely adjusting a high-frequency gain may also be added to the aforesaid construction. As shown in FIG. 22, an image quality adjusting circuit 114 is connected to a first current adding circuit 321 for adding an offset current to the reference current of the gyrator of an equivalent resistor $ER_1$ (317) which constitutes an amplitude filter, and a second current adding circuit 322 for adding the offset current to the reference current of the gyrator of at least one equivalent resistor which constitutes a group delay filter, whereby the Q of the group delay filter can be finely adjusted in response to a variation in the Q of the amplitude filter. With this arrangement, it is possible to adjust a high-frequency gain while retaining good group delay characteristics.

As is apparent from the foregoing description, by controlling the cut-off frequency and the Q of the equalizing means by using a common control signal, it is possible to perform optimum equalization corresponding to reproduced data without the need to increase the entire circuit scale.

What is claimed is:

1. A reproducing apparatus comprising:
    (a) reproducing means for reproducing data;
    (b) equalizing means for equalizing the reproduced data;
    (c) generating means for generating a clock synchronized with the reproduced data; and
    (d) phase difference detecting means for detecting a phase difference between the reproduced data equalized by said equalizing means and the clock,
        a generating operation of said generating means and an amplification characteristic of said equalizing means being controlled on the basis of an output from said phase difference detecting means.

2. An apparatus according to claim 1, wherein said equalizing means includes a filter having a quality factor which can be controlled, the quality factor of said filter being controlled on the basis of the output from said phase difference detecting means.

3. An apparatus according to claim 1, wherein a group delay characteristic of said equalizing means is controlled on the basis of the output from said phase difference detecting means.

4. An apparatus according to claim 3, wherein said equalizing means includes a filter having a cut-off frequency which can be controlled, the cut-off frequency of said filter being controlled on the basis of the output from said phase difference detecting means.

5. An apparatus according to claim 4, wherein said generating means includes a filter having a cut-off frequency which can be controlled, the cut-off frequency of said filter of said generating means being controlled on the basis of the output from said phase difference detecting means.

6. An apparatus according to claim 2, further comprising adding means for adding an offset signal to the output from said phase difference detecting means which is outputted to said filter, the quality factor of said filter being controlled on the basis of an output from said adding means.

7. An apparatus according to claim 2, wherein said phase difference detecting means includes a loop filter for filtering and outputting a signal indicative of a phase difference between the reproduced data and the clock, and the quality factor of said filter and the generating operation are controlled on the basis of an output from said loop filter.

8. An apparatus according to claim 1, wherein said equalizing means and said generating means respectively include filters which respectively have second orders and cut-off frequencies which can be controlled, and the cut-off frequency of said filter which constitutes said equalizing means and the cut-off frequency of said filter which constitutes said generating means are close to each other, the cut-off frequency of said filter which constitutes said equalizing means and the cut-off frequency of said filter which constitutes said generating means being controlled on the basis of the output from said phase difference detecting means.

9. A reproducing apparatus comprising:
(a) reproducing means for reproducing data;
(b) equalizing means having filter means, for equalizing the reproduced data;
(c) clock generating means for generating a clock synchronized with the reproduced data;
(d) phase difference detecting means for detecting a phase difference between output data from said equalizing means and the clock; and
(e) control means for controlling a cut-off frequency and a quality factor of said filter means by using an output from said phase difference detecting means.

10. An apparatus according to claim 9, wherein said filter means includes a plurality of filters which respectively have second orders, said plurality of filters having a similar circuit form and a similar mask construction.

11. An apparatus according to claim 10, wherein said plurality of filters include an amplitude filter for controlling an amplitude of the reproduced data and a group delay filter for controlling a group delay of the reproduced data.

12. An apparatus according to claim 10, wherein at least a part of said plurality of filters have equivalent inductors respectively formed by gyrators which can be controlled by a reference current, and said control means supplies the output from said phase difference detecting means to said equivalent inductors as the reference current.

13. An apparatus according to claim 10, wherein at least a part of said plurality of filters have equivalent resistors respectively formed by gyrators which can be controlled by a reference current, and said control means supplies the output from said phase difference detecting means to said equivalent resistors as the reference current.

14. An apparatus according to claim 9, wherein said filter means includes a transconductance circuit.

15. A reproducing apparatus comprising:
(a) reproducing means for reproducing data;
(b) equalizing means for equalizing the reproduced data, said equalizing means having a filter composed of an equivalent inductor formed by a gyrator which can be controlled by a reference current and an equivalent resistor formed by a gyrator which can be controlled by the reference current; and
(c) control means for supplying the same reference current to said gyrator which constitutes said equivalent inductor and said gyrator which constitutes said equivalent resistor.

16. An apparatus according to claim 15, wherein said equalizing means includes a plurality of said filters, and each of said plurality of filters includes an LC network having said equivalent inductor and a capacitor connected to said equivalent inductor and a resistor network having said equivalent resistor and a resistor connected to said equivalent resistor.

17. An apparatus according to claim 16, wherein said plurality of filters include an amplitude filter for controlling an amplitude of the reproduced data and a group delay filter for controlling a group delay of the reproduced data.

18. An apparatus according to claim 15, wherein said gyrators which respectively constitute said equivalent inductor and said equivalent resistor have a similar circuit form and a similar mask construction and are formed on one integrated circuit.

19. An apparatus according to claim 15, wherein said control means includes adding means for adding an offset current to the reference current, and supplies an output current from said adding means to said gyrators.

20. An apparatus according to claim 15, wherein said control means includes phase difference detecting means for detecting a phase difference between a clock synchronized with the reproduced data and the reproduced data equalized by said equalizing means, and generating means for generating the clock according to an output from said phase difference detecting means, said control means supplying the output from said phase difference detecting means as the reference current.

21. A data reproducing apparatus comprising:
reproducing means for reproducing data;
equalizing means for equalizing the reproduced data;
clock generating means for generating a clock synchronized with the reproduced data; and
control means for controlling said clock generating means by a control signal,
an amplitude characteristic of said equalizing means being controlled by the control signal.

22. An apparatus according to claim 21, wherein said control means controls said clock generating means by the control signal to vary a frequency of the clock.

23. An apparatus according to claim 21, wherein said equalizing means includes a filter having a quality factor which can be controlled, and the quality factor of said filter is controlled by the control signal.

24. An apparatus according to claim 21, wherein a group delay characteristic of said equalizing means is controlled by the control signal.

25. An apparatus according to claim 24, wherein said equalizing means includes a filter having a cut-off frequency which can be controlled, and the cut-off frequency is controlled by the control signal.

26. An apparatus according to claim 1, further comprising detection means for detecting digital data from the reproduced data output from said equalizing means, said generating means generating the clock by using the digital data detected by said detection means.

27. An apparatus according to claim 9, further comprising detection means for detecting digital data from the reproduced data output from said equalizing means, said clock generating means generating the clock by using the digital data detected by said detection means.

28. An apparatus according to claim 15, further comprising detection means for detecting digital data from the reproduced data output from said equalizing means, said control means supplying the same reference current by using the digital data.

29. An apparatus according to claim 20, further comprising detection means for detecting digital data from the reproduced data output from said equalizing means, said phase difference detecting means detecting the phase difference by using the digital data.

30. A reproducing apparatus, comprising:
reproducing means for reproducing data from a recording medium;
equalizing means for equalizing the reproduced data, said equalizing means having a filter composed of a gyrator;
clock generating means for generating a clock synchronized with the reproduced data, said clock generating means having a filter composed of a gyrator; and
phase-difference detection means for detecting a phase difference between the reproduced data equalized by said equalizing means and the clock, and generating a control signal,
said gyrator which constitutes the filter of said equalizing means and said gyrator which constitutes the filter of said clock generating means being controlled by the same control signal generated by said phase-difference detection means.

31. An apparatus according to claim 30, further comprising detection means for detecting digital data from the reproduced data equalized by said equalizing means, said phase-difference detection means detecting the phase difference by using the digital data.

32. An apparatus according to claim 30, wherein the filter of said equalizing means has second order, and a cut-off frequency of the filter of said equalizing means is changed by controlling said gyrator.

33. A data processing device, comprising:
input means for inputting data reproduced from a recording medium;
equalizing means for equalizing the input data, said equalizing means having a first circuit element;
generating means for generating a clock phase synchronized with the input data, said generating means having a second circuit element, said first circuit element of said equalizing means and said second circuit element of said generating means having a similar circuit form; and
control means for detecting a phase difference between the input data equalized by said equalizing means and the clock, and generating a control signal according to the detection result, said control means controlling a generating operation of said generating means and an equalizing characteristic of said equalizing means by controlling said first circuit element of said equalizing means and said second circuit element of said generating means with the control signal.

34. A device according to claim 33, wherein each of said first element and said second element is part of a filter.

35. A device according to claim 34, wherein said control means controls a cut-off frequency and a quality factor of the filters of said equalizing means.

36. A device according to claim 35, wherein the filters of said equalizing means include an amplitude filter for controlling an amplitude of the input data and a group delay filter for controlling a group delay of the input data.

37. A device according to claim 34, wherein the filters of said equalizing means have second order.

38. A device according to claim 33, wherein said control means controls said second element with the control signal to vary a frequency of the clock.

39. A device according to claim 33, wherein said control means controls said first element with the control signal to change an amplitude characteristic of said equalizing means.

40. A device according to claim 33, wherein said control means controls said first element to change a group delay characteristic of said equalizing means.

41. A device according to claim 33, further comprising detection means for detecting digital data from the reproduced data output from said equalizing means according to the clock, said control means detecting the phase difference by using the digital data detected by said detection means.

* * * * *

UNITED STATES PATENT AND TRADEMARK OFFICE
CERTIFICATE OF CORRECTION

PATENT NO. : 5,887,030
DATED : March 23, 1999
INVENTOR(S) : Yoshiyuki Sasaki et al.

It is certified that error appears in the above-identified patent and that said Letters Patent is hereby corrected as shown below:

Col. 8, line 53, delete "R'" and insert $R_1'$ --.
Col. 8, line 57, delete "$E_7$" and insert $ER_2$ --.

Signed and Sealed this

Twenty-eighth Day of December, 1999

Attest:

Q. TODD DICKINSON

*Attesting Officer*     *Acting Commissioner of Patents and Trademarks*